(12) United States Patent
Kim et al.

(10) Patent No.: US 10,541,277 B2
(45) Date of Patent: Jan. 21, 2020

(54) ORGANIC LIGHT EMITTING DISPLAY DEVICE

(71) Applicant: LG Display Co., Ltd., Seoul (KR)

(72) Inventors: Ho-Jin Kim, Seoul (KR); Jong Sung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/791,197

(22) Filed: Oct. 23, 2017

(65) Prior Publication Data
US 2018/0158882 A1    Jun. 7, 2018

(30) Foreign Application Priority Data
Dec. 6, 2016    (KR) .................. 10-2016-0164881

(51) Int. Cl.
*H01L 27/32*    (2006.01)
*G09G 3/3291*   (2016.01)
*H01L 51/52*    (2006.01)

(52) U.S. Cl.
CPC ....... *H01L 27/3213* (2013.01); *G09G 3/3291* (2013.01); *H01L 27/322* (2013.01); *H01L 27/3218* (2013.01); *H01L 27/3246* (2013.01); *H01L 27/3248* (2013.01); *H01L 51/5284* (2013.01); *G09G 2300/0443* (2013.01); *G09G 2300/0452* (2013.01); *G09G 2310/08* (2013.01); *G09G 2320/0233* (2013.01)

(58) Field of Classification Search
CPC ............. H01L 27/3213; H01L 27/3246; H01L 51/5284; H01L 27/322; H01L 27/3248; H01L 27/3218; G09G 3/3291; G09G 2310/08; G09G 2300/0452; G09G 2300/0443; G09G 2320/0233
See application file for complete search history.

(56) References Cited

U.S. PATENT DOCUMENTS

| | | | |
|---|---|---|---|
| 10,242,653 B2* | 3/2019 | Hayashi | G09G 5/391 |
| 10,263,050 B2* | 4/2019 | Hack | H01L 27/3218 |
| 2014/0226323 A1 | 8/2014 | Huang et al. | |
| 2014/0319479 A1 | 10/2014 | Park et al. | |
| 2015/0108455 A1* | 4/2015 | Jung | H01L 27/3246 257/40 |
| 2015/0301239 A1 | 10/2015 | Xi et al. | |
| 2016/0041424 A1 | 2/2016 | Guo et al. | |

(Continued)

FOREIGN PATENT DOCUMENTS

| | | |
|---|---|---|
| CN | 1588197 A | 3/2005 |
| EP | 2 797 134 A1 | 10/2014 |

(Continued)

*Primary Examiner* — Victor A Mandala
(74) *Attorney, Agent, or Firm* — Seed IP Law Group LLP

(57) ABSTRACT

Disclosed is an organic light emitting display device which is capable of maximizing a luminance improvement by an appropriate arrangement of a white pixel in a pixel, wherein the organic light emitting display device comprises a plurality of pixels, wherein each pixel includes a first subpixel for emitting first-color light, a second subpixel for emitting second-color light, a third subpixel for emitting third-color light, and a fourth subpixel for emitting fourth-color light, wherein the fourth subpixel for each pixel is disposed between the first and second subpixels, and between the first and third subpixels.

23 Claims, 9 Drawing Sheets

(56) References Cited

U.S. PATENT DOCUMENTS

| | | | |
|---|---|---|---|
| 2016/0276416 A1* | 9/2016 | Ma | C23C 14/042 |
| 2016/0315127 A1* | 10/2016 | Yoon | H01L 27/3218 |
| 2016/0322000 A1* | 11/2016 | Kim | G09G 3/2003 |
| 2016/0329384 A1 | 11/2016 | Hou | |
| 2017/0125489 A1* | 5/2017 | Jang | H01L 27/3213 |

FOREIGN PATENT DOCUMENTS

| | | |
|---|---|---|
| JP | 2006-512732 A | 4/2006 |
| JP | 2007-531062 A | 11/2007 |
| JP | 2016-90812 A | 5/2016 |
| TW | 201541169 A | 11/2015 |

\* cited by examiner

ORGANIC LIGHT EMITTING DISPLAY DEVICE

CROSS REFERENCE TO RELATED APPLICATIONS

This application claims priority from and the benefit of the Korean Patent Application No. 10-2016-0164881 filed on Dec. 6, 2016, which is hereby incorporated by reference in its entirety.

BACKGROUND

Technical Field

Embodiments of the present disclosure relate to an organic light emitting display device.

Description of the Related Art

With the advancement of an information-oriented society, various requirements for the display device of displaying an image are increasing. Thus, various display devices of a liquid crystal display (LCD) devices, a plasma display panel (PDP) devices, and an organic light emitting display (OLED) device have been utilized.

The OLED device is a self light emitting display device. In comparison to the LCD device, the OLED device has wider viewing angle and greater contrast ratio. Also, the OLED device may be fabricated with a lightweight and slim size as it does not need a separate light source, unlike the LCD device, and furthermore the OLED device is favorable in view of power consumption. In addition, the OLED device may be driven by a low D.C. voltage, and a response speed of the OLED device is rapid. Especially, the OLED device may have the advantage of low manufacturing cost.

The OLED device may include pixels respectively provided with organic light emitting devices, and a bank for dividing the pixels so as to define the pixels. The bank functions as a pixel defining film. The organic light emitting device may include an anode electrode, a hole transporting layer, an organic light emitting layer, an electron transporting layer, and a cathode electrode. In this case, when a high potential voltage is applied to the anode electrode, and a low potential voltage is applied to the cathode electrode, holes and electrons are respectively moved to the organic light emitting layer via the hole transporting layer and the electron transporting layer, and are then combined to one another in the organic light emitting layer, to thereby emit light.

For realizing high resolution, respective pixels may include a red pixel(s) for emitting red light, a green pixel(s) for emitting green light, a blue pixel(s) for emitting blue light, and a white pixel for emitting white light. In this case, the high resolution is highly influenced by the white pixel.

BRIEF SUMMARY

Accordingly, embodiments of the present disclosure are directed to an organic light emitting display device that substantially obviates one or more problems due to limitations and disadvantages of the related art.

An aspect(s), of embodiments of the present disclosure is directed to providing an organic light emitting display device which is capable of maximizing a luminance improvement by an appropriate arrangement of a white pixel(s) in a plurality of color pixels.

Additional advantages and features of embodiments of the disclosure will be set forth in part in the description herein and in part will become apparent to those having ordinary skill in the art upon examination of the description herein or may be learned from practicing the embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of embodiments of the disclosure, as embodied and broadly described herein, there is provided an organic light emitting display (OLED) device including a plurality of pixels, wherein each pixel includes a first subpixel for emitting a first color light, a second subpixel for emitting a second color light, a third subpixel for emitting a third color light, and a fourth subpixel for emitting a fourth color light, wherein the fourth subpixel for each pixel is disposed between the first and second subpixels, and between the first and third subpixels.

It is to be understood that both the foregoing general description and the following detailed description of embodiments of the present disclosure are examples and explanatory and are intended to provide further explanation of the invention as claimed.

BRIEF DESCRIPTION OF THE SEVERAL VIEWS OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION

Figure 1:
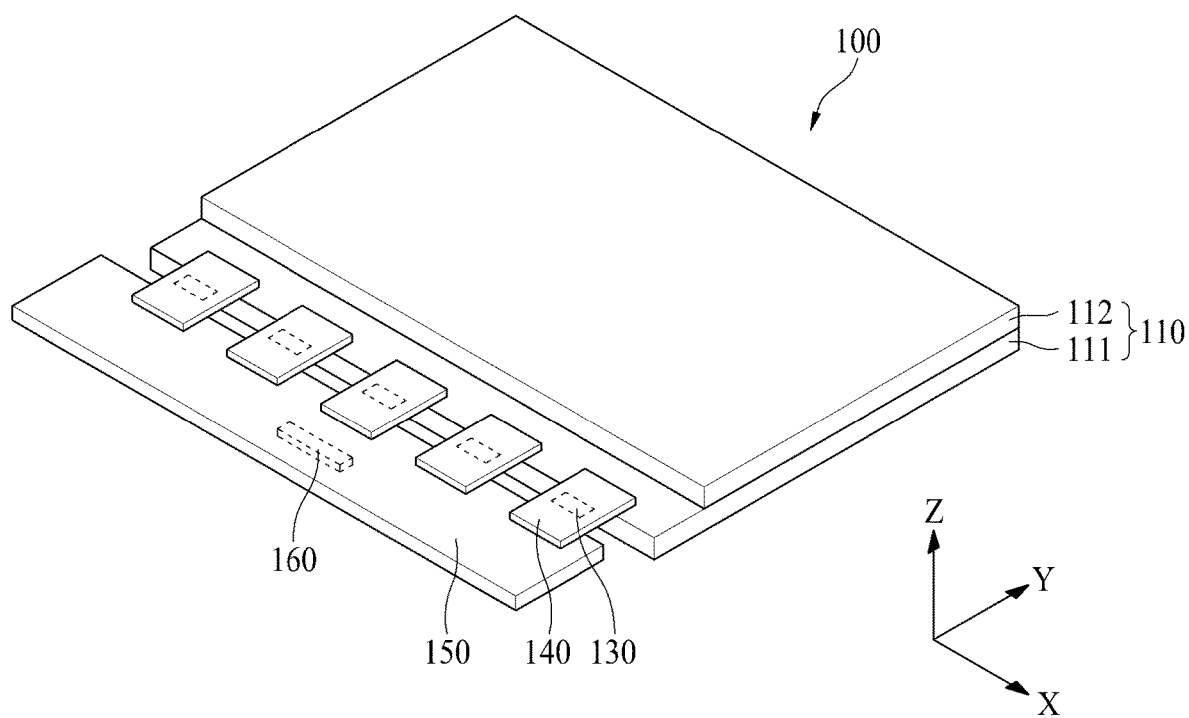
FIG. 1 is a perspective view illustrating an OLED device according to one embodiment of the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through example embodiments described herein with reference to the accompanying drawings. The present disclosure may, however, be embodied in different forms and should not be construed as limited to the example embodiments set forth herein. Rather, these example embodiments are provided to facilitate a thorough and complete understanding of the disclosure, and to convey the scope of the present disclosure to those skilled in the art. Further, the scope of the present invention is only defined by the claims.

A shape, a size, a ratio, an angle, a scale, and a number disclosed in the drawings for describing embodiments of the present disclosure are merely an example(s), and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error region although there is no explicit description.

In describing a position relationship, for example, when the positional order is described as 'on~', 'above~', 'below~', and 'next~', a case which is not contact may be included unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an organic light emitting display (OLED) device according to the embodiment of the present disclosure will be described in detail with reference to the accompanying drawings.

Figure 2:
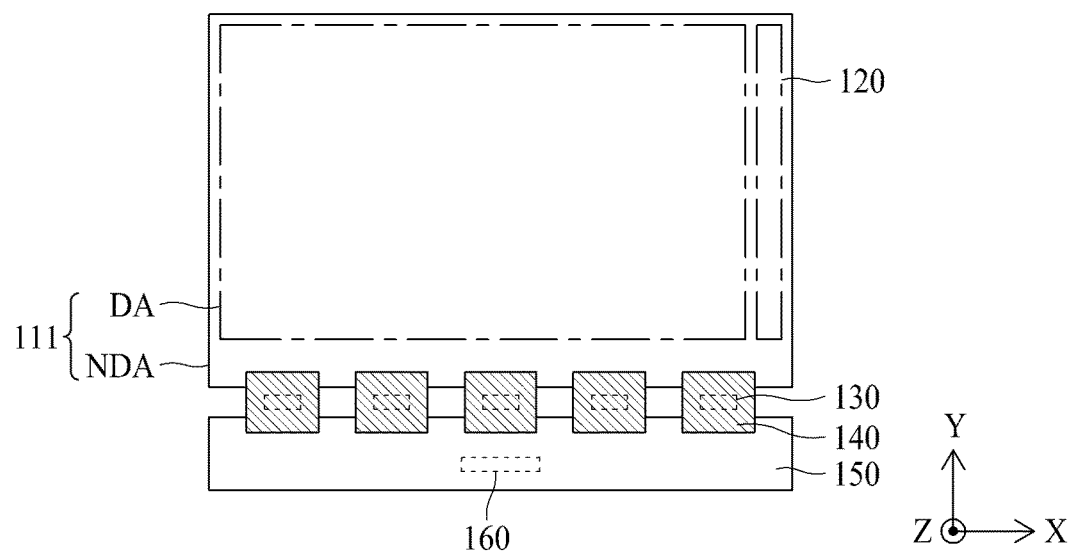
FIG. 2 is a plane view illustrating, among others, a first substrate, a gate driver, a source drive IC, a flexible film, a circuit board, and a timing controller of FIG. 1.

FIG. 1 is a perspective view illustrating an OLED device according to one embodiment of the present disclosure. FIG. 2 is a plane view illustrating a first substrate, a gate driver, a source drive IC, a flexible film, a circuit board, and a timing controller of FIG. 1.

Referring to FIGS. 1 and 2, a display device 100 according to one embodiment of the present disclosure may include a display panel 110, a gate driver 120, a source drive integrated circuit (source drive IC) 130, a flexible film 140, a circuit board 150, and a timing controller 160.

The display panel 110 may include a first substrate 111 and a second substrate 112. The second substrate 112 may be an encapsulation substrate. The first substrate 111 may be a plastic film or a glass substrate. The second substrate 112 may be a plastic film, a glass substrate, and/or an encapsulation film (or protection film).

On one surface of the first substrate 111 confronting the second substrate 112, there are gate lines, data lines and pixels (not shown for simplicity). The pixels are prepared in respective areas defined by crossing the gate lines and the data lines. A pixel may include multiple subpixels.

Each of the pixels or subpixels thereof may include a thin film transistor, and an organic light emitting device including a first electrode, an organic light emitting layer, and a second electrode. If a gate signal is supplied from a gate line to each pixel through the thin film transistor, a predetermined current is supplied to the organic light emitting device in accordance with a data voltage of a data line. Accordingly, the organic light emitting device for each of the pixels may emit light with a predetermined brightness in accordance with the predetermined current. A structure(s) of the pixels and/or the subpixels will be described in detail with reference to FIGS. 3 to 8.

As shown in FIG. 2, the display panel 110 may include a display area (DA) provided with the pixels for displaying an image, and a non-display area (NDA) in which an image is not displayed. The gate lines, the data lines, and the pixels may be provided in the display area (DA), and the gate driver 120 and pads may be provided in the non-display area (NDA).

The gate driver 120 supplies gate signals to the gate lines in accordance with a gate control signal which is input from the timing controller 160. The gate driver 120 may be provided in one side of the display area (DA) of the display panel 110, or the non-display area (NDA) of both peripheral sides of the display panel 110 by a gate driver in panel (GIP) method. In another way, the gate driver 120 may be manufactured in a driving chip, may be mounted on the flexible film, and may be attached to one side of the display area (DA) of the display panel 110, or the non-display area (NDA) of both peripheral sides of the display panel 110 by a tape automated bonding (TAB) method.

The source drive IC 130 receives digital video data and source control signals from the timing controller 160. The source drive IC 130 converts the digital video data into analog data voltages in accordance with the source control signal, and supplies the analog data voltages to the data lines. If the source drive IC 130 is manufactured in a driving chip, the source drive IC 130 may be mounted on the flexible film 140 by a chip on film (COF) method or a chip on plastic (COP) method.

The pads such as data pads may be provided in the non-display area (NDA) of the display panel 110. In the flexible film 140, there are lines for connecting the pads with the source drive IC 130, and lines for connecting the pads with the lines of the circuit board 150. The flexible film 140 is attached to the pads by the use of anisotropic conducting film, whereby the pads may be connected with the lines of the flexible film 140.

The circuit board 150 may be attached to the flexible film 140. A plurality of circuits, which are implemented in a plurality of driving chips, may be included in, e.g., mounted on, the circuit board 150. For example, the timing controller 160 may be mounted on the circuit board 150. The circuit board 150 may be a printed circuit board or a flexible printed circuit board.

The timing controller 160 receives digital video data and a timing signal from an external system board via a cable of the circuit board 150. The timing controller 160 generates the gate control signal for controlling an operation timing of the gate driver 120 and the source control signal for controlling the source drive IC 130 on the basis of the timing signal. The timing controller 160 supplies the gate control signal to the gate driver 120, and supplies the source control signal to the source drive IC 130.

Figure 3:
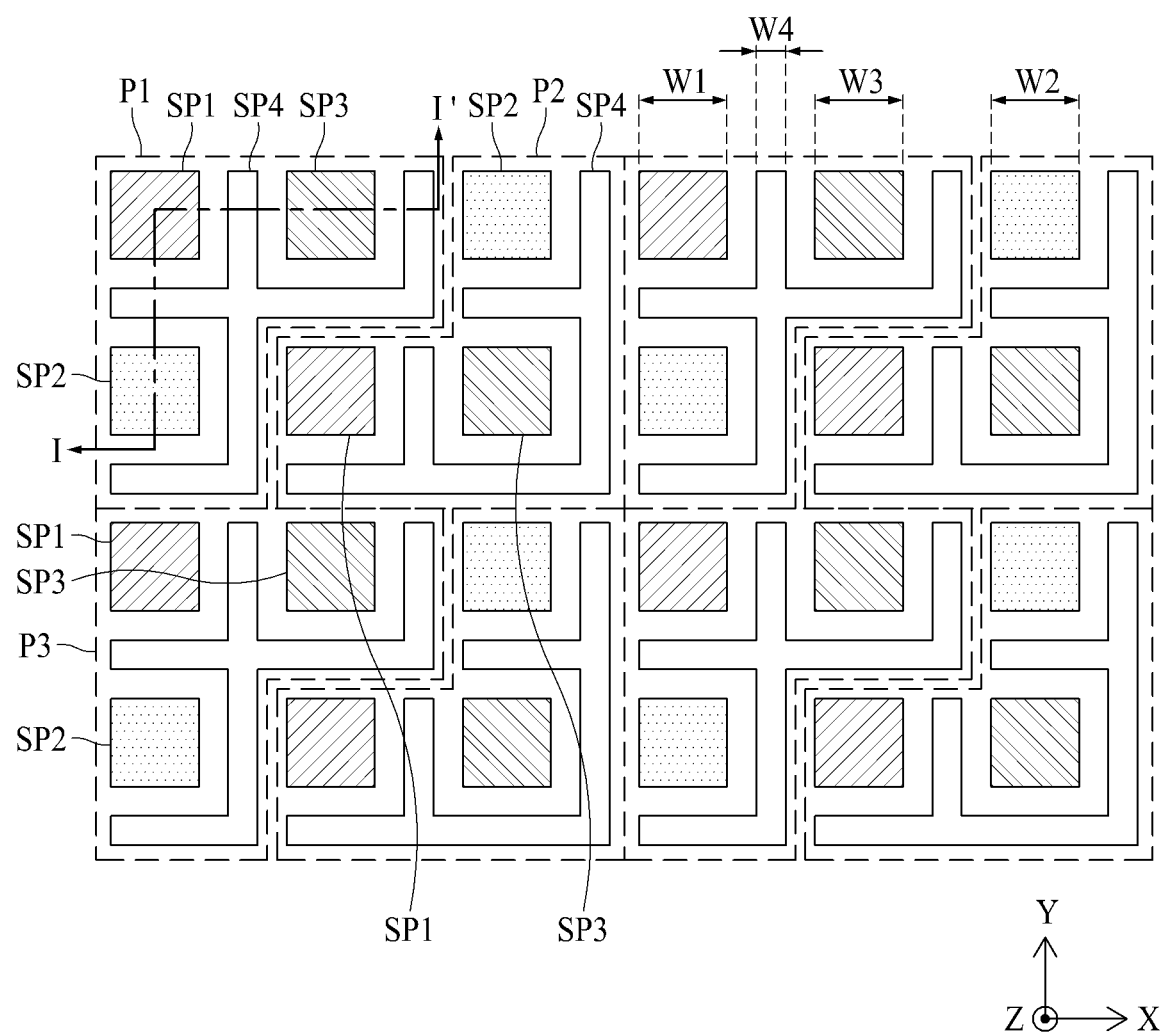
FIG. 3 is a plane view illustrating one example of pixels in a display area.

FIG. 3 is a plane view illustrating one example of the pixels in the display area.

In FIG. 3, the pixels which neighbor each other in, for example, the first direction (X-axis direction) are referred to as the first and second pixels (P1, P2).

Referring to FIG. 3, each of the pixels (P1, P2) includes first to fourth subpixels (SP1~SP4). The first subpixel (SP1) emits first-color light, the second subpixel (SP2) emits second-color light, the third subpixel (SP3) emits third-color light, and the fourth subpixel (SP4) emits fourth-color light. For example, the first subpixel (SP1) may be a red subpixel for emitting red light, the second subpixel (SP2) may be a green subpixel for emitting green light, the third subpixel (SP3) may be a blue subpixel for emitting blue light, and the fourth subpixel (SP4) may be a white sub pixel for emitting white light, but not limited to this structure. Other color combinations for the subpixels are possible and included. For example, the color combination of the subpixels may include CYGM_filter pattern (cyan, yellow, green, magenta) or RGBE filter pattern (red, green, blue, emerald).

It should be appreciated that a subpixel that emits a color light may include scenarios that the subpixel includes a light emitting layer that emits the color light and/or that the subpixel include a light emitting layer that emits white light and a color filter for the specific color light.

The first to fourth subpixels (SP1~SP4) of the first pixel (P1) are differently arranged from the first to fourth subpixels (SP1~SP4) of the second pixel (SP2). Especially, the arrangement of the first to third subpixels (SP1~SP3) of the first pixel (P1) is different from the arrangement of the first to third subpixels (SP1~SP3) of the second pixel (P2) so that the shape of the fourth subpixel (SP4) of the first pixel (P1) is different from the shape of the fourth subpixel (SP4) of the second pixel (P2).

In detail, the first and second subpixels (SP1, SP2) of the first pixel (P1) are arranged in the second direction (Y-axis direction) crossing over the first direction (X-axis direction), as shown in FIG. 3, and the first and third sub pixels (SP1, SP3) may be arranged in the first direction (X-axis direction). Meanwhile, the first and third subpixels (SP1, SP3) of the second pixel (SP2) are arranged in the first direction (X-axis direction), as shown in FIG. 3, and the second and third subpixels (SP2, SP3) of the second pixel (P2) may be arranged in the second direction (Y-axis direction). Also, the first and third subpixels (SP1, SP3) of the first pixel (SP1) and the second subpixel (SP2) of the second pixel (P2) may be parallel to one another in the first direction (X-axis direction), and the second subpixel (SP2) of the first pixel (P1) and the first and third subpixels (SP1, SP3) of the second pixel (P2) may be parallel to one another in the first direction (X-axis direction).

The fourth subpixel (SP4) of the first pixel (P1) may be disposed between the first and second subpixels (SP1, SP2) and between the first and third subpixels (SP1, SP3). Also, the fourth subpixel (SP4) of the first pixel (P1) may be disposed between the third subpixel (SP3) of the first pixel (P1) and the second subpixel (SP2) of the second pixel (P2) and between the second subpixel (SP2) of the first pixel (P1) and the first subpixel (SP1) of the second pixel (P2). Also, the fourth subpixel (SP4) of the first pixel (P1) may be disposed between the second subpixel (SP2) of the first pixel (P1) and the first subpixel (SP1) of the neighboring another first pixel (P1).

The fourth subpixel (SP4) of the second pixel (P2) may be disposed between the first and third subpixels (SP1, SP3) and between the second and third subpixels (SP2, SP3). Also, the fourth subpixel (SP4) of the second pixel (P2) may be disposed between the second subpixel (SP2) of the second pixel (P2) and the first subpixel (SP1) of the first pixel (P1) and between the third subpixel (SP3) of the second pixel (P2) and the second subpixel (SP2) of the first pixel (P1). Also, the fourth subpixel (SP4) of the second pixel (P2) may be disposed between the first subpixel (SP1) of the second pixel (P2) and the first subpixel (SP1) of the neighboring another second pixel (P2).

Therefore, within each of the first pixel (P1) and the second pixel (P2), none of the first subpixel (SP1), second subpixel (SP2) and the third subpixel (SP3) is immediately adjacent to one another and any adjacent two of them in either the first direction (X-axis direction) or the second direction (Y-axis direction) are interposed by the fourth subpixel (SP4). In this disclosure, two adjacent ones of the first subpixel (SP1), the second subpixel (SP2) and the third subpixel (SP3) (and a fifth subpixel (SP5) as will be described herein) are adjacent to one another except an interposing fourth subpixel (SP4).

Further, between the neighboring first pixel (P1) and second pixel (P2), none of the first subpixel (SP1), the second subpixel (SP2) and the third subpixel (SP3) of the first pixel (P1) and the first subpixel (SP1), the second subpixel (SP2) and the third subpixel (SP3) of the second pixel (P2) is immediately adjacent to one another and any adjacent two of them (along either the first direction or the second direction) are interposed by a fourth subpixel (SP4) of one of the first pixel (P1) or the second pixel (P2). For example, the adjacent third subpixel (SP3) of the first pixel (P1) and the second subpixel (SP2) of the second pixel (P2) along the first direction (the X-axis direction) are interposed by the fourth subpixel (SP4) of the first pixel (P1). The adjacent third subpixel (SP3) of the first pixel (P1) and the first subpixel (SP1) of the second pixel (P2) along the second direction (the Y-axis direction) are interposed by the fourth subpixel (SP4) of the first pixel (P1).

Further, among the first subpixels (SP1), the second subpixels (SP2) and the third subpixels (SP3) of the first pixel (P1) and the second pixel (P2), none of two same color subpixels are adjacent to one another, even with the interposing fourth pixel (SP4) of one of the first pixel (P1) or the second pixel (P2).

A width (W4) of the fourth subpixel (SP4) in a first direction (X-axis direction) of each of the pixels (P1, P2) may be smaller than a width (W1) of the first subpixel (SP1)

in the first direction (X-axis direction), a width (W2) of the second subpixel (SP2) in the first direction (X-axis direction), and a width (W3) of the third subpixel (SP3) in the first direction (X-axis direction). Even though the width (W4) of the fourth subpixel (SP4) in the first direction (X-axis direction) is smaller than the width of each of the first to third subpixels (SP1, SP2, SP3) in the first direction (X-axis direction), the fourth subpixel (SP4) is disposed between each of the first to third subpixels (SP1~SP3), whereby an area of the fourth subpixel (SP4) in each pixel (P1, P2) is similar to an area for each of the first to third subpixels (SP1~SP3). That is, the fourth subpixel (SP4) is appropriately disposed in each pixel (P1, P2) so that it is possible to maximize a luminance improvement by the fourth subpixel (SP4). In another example, an area of the fourth subpixel (SP4) in each pixel (P1, P2) is smaller than an area for each of the first to third subpixels (SP1~SP3).

As described above, the fourth subpixel (SP4) for each of the pixels (P1, P2) is disposed between each two of the first to third subpixels (SP1~SP3). Accordingly, it is possible to emit white light by the use of the fourth subpixel (SP4) disposed between each of the first to third subpixels (SP1~SP3), to thereby maximize a luminance improvement by the white pixel.

It should be appreciated that although the descriptions about the neighboring first pixel (P1) and second pixel (P2) refers to the neighboring relationship along the first direction (X-axis direction) as an illustrative example, the same or similar descriptions also apply to neighboring pixels in the second direction (Y-axis direction), which is included in the disclosure.

For example, a third pixel (P3) may neighbor both the first pixel (P1) and the second pixel (P2) in the second direction (Y-axis direction). Adjacent first subpixel (SP1) of the third pixel (P3) and second subpixel (SP2) of the first pixel (P1) are interposed by the fourth subpixel (SP4) of the first pixel (P1). Adjacent third subpixel (SP3) of the third pixel (P3) and first subpixel (SP1) of the second pixel (P2) are interposed by the fourth subpixel (SP4) of the second pixel (P2).

Figure 4A:
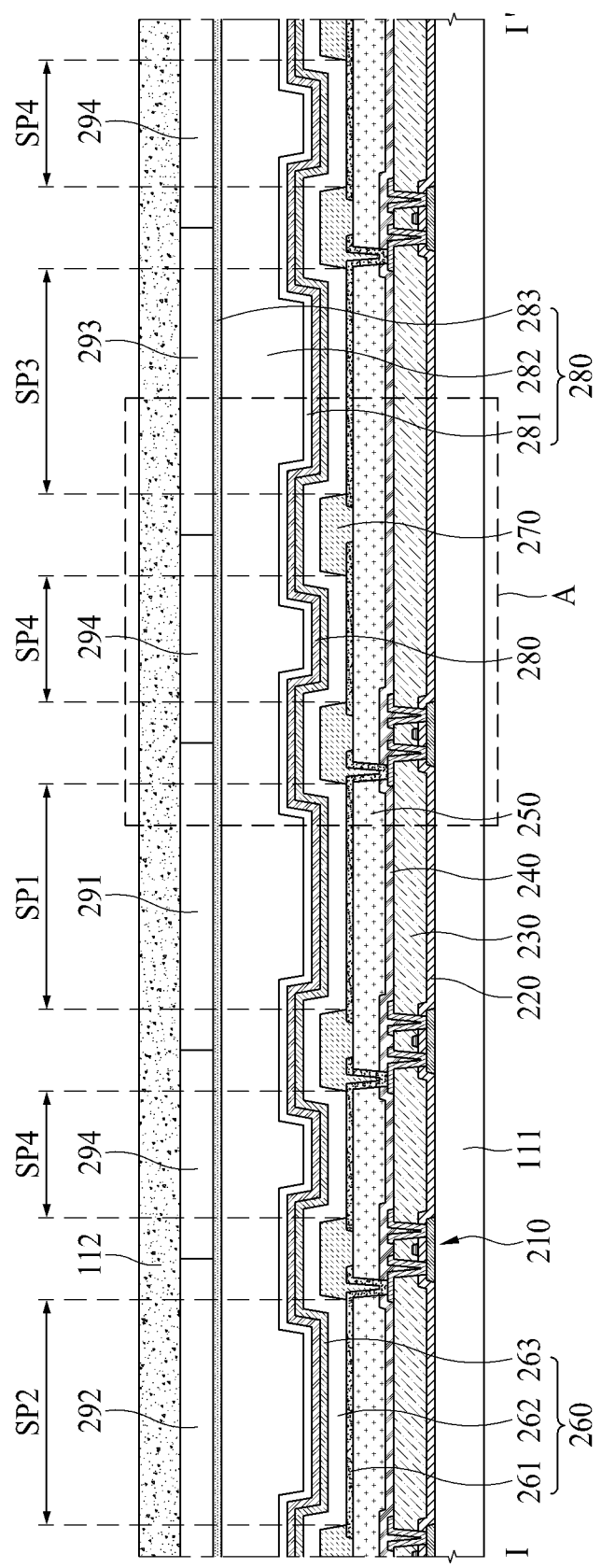
FIG. 4A is an example cross sectional view along I-I' of FIG. 3.

FIG. 4A is a cross sectional view along I-I' of FIG. 3.

Referring to FIG. 4A, a buffer film (not shown for simplicity) is provided on one surface of the first substrate 111 confronting the second substrate 112. The buffer film is provided on one surface of the first substrate 111 so as to protect thin film transistors 210 and organic light emitting devices 260 from moisture permeating through the first substrate 111 which is vulnerable to moisture permeability. The buffer film may be formed of a plurality of inorganic films alternately deposited. For example, the buffer film may be formed in a multi-layered structure by alternately depositing at least one inorganic film from a silicon oxide film (SiOx), a silicon nitride film (SiNx), and silicon oxynitride (SiON). It is possible to omit the buffer film.

The thin film transistor 210 is provided on the buffer film. A first electrode 261 for each of the first to fourth subpixels (SP1, SP2, SP3, SP4) may be connected with at least one thin film transistor. The first electrode 261 of the fourth subpixel (SP4) is connected with the thin film transistor 210 in the space, for example, between the first and second subpixels (SP1, SP2), but not limited to this structure. That is, the first electrode 261 of the fourth subpixel (SP4) may be connected with the thin film transistor 210 in the area between the first and third sub pixels (SP1, SP3) or in another area.

Figure 5:
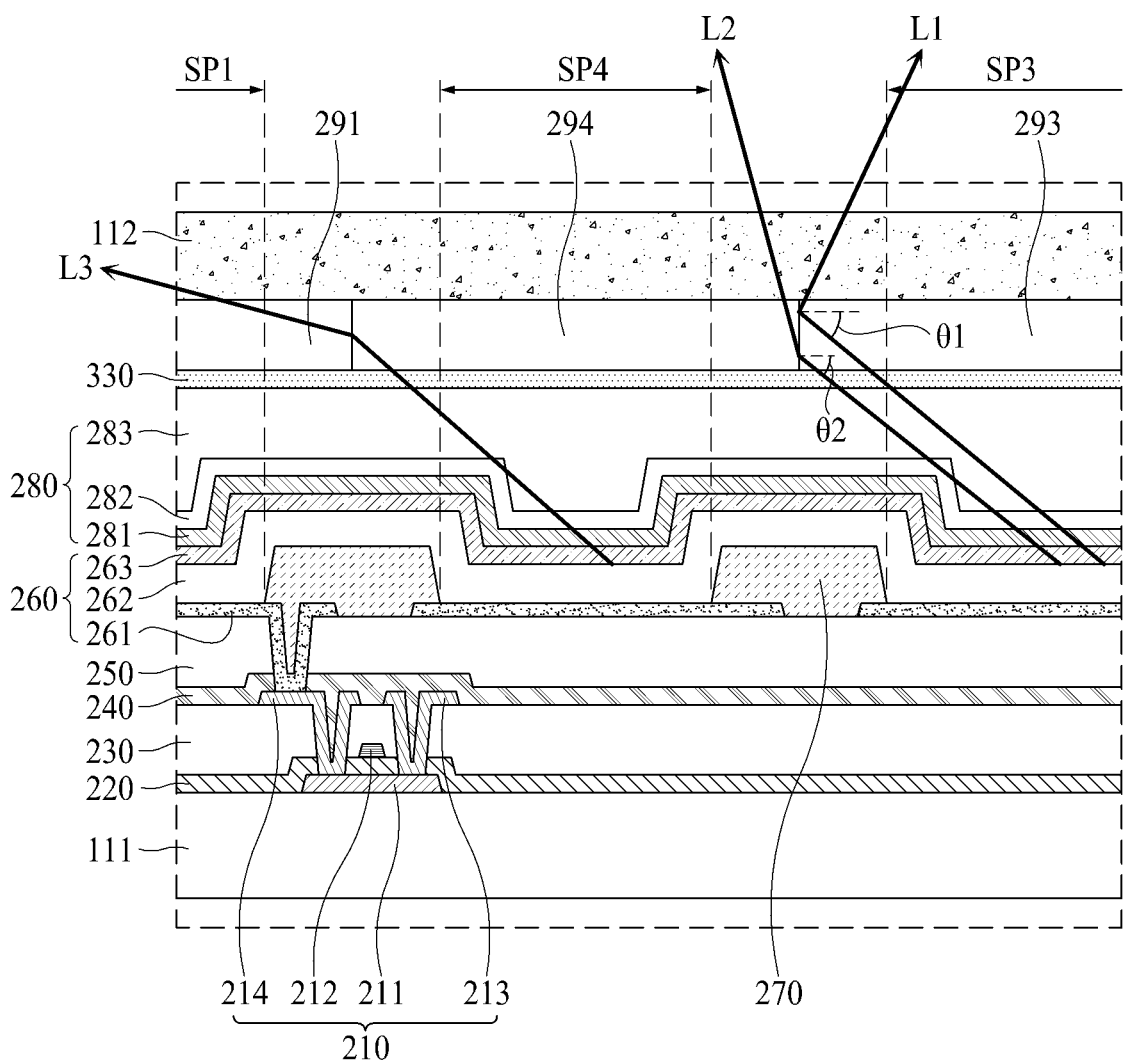
FIG. 5 is an enlarged cross sectional view illustrating 'A' portion of FIG. 4A.

Referring to FIGS. 4A and 5 together, the thin film transistor 210 may include an active layer 211, a gate electrode 212, a source electrode 213, and a drain electrode 214. In FIG. 5, the thin film transistor 210 is provided in a top gate type where the gate electrode 212 is positioned above the active layer 211, but not limited to this type. For example, the thin film transistor 210 may be provided in a bottom gate type where the gate electrode 212 is positioned below the active layer 211, or a double gate type where the gate electrode 212 is positioned both above and below the active layer 211.

The active layer 211 is provided on the buffer film (not shown for simplicity). The active layer 211 may be formed a silicon-based semiconductor material or oxide-based semiconductor material. A light shielding layer may be additionally provided between the buffer film and the active layer 211 so as to block external light being incident on the active layer 211.

A gate insulating film 220 may be provided on the active layer 211. The gate insulating film 220 may be formed in a single-layered structure of the inorganic insulating material such as silicon oxide (SiOx) or silicon nitride (SiNx), or a multi-layered structure of the above silicon oxide (SiOx) and silicon nitride (SiNx), but not limited to these structures.

The gate electrode 212 and gate line may be provided on the gate insulating film 220. The gate electrode 212 and gate line may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but not limited to these materials.

An insulating interlayer 230 may be provided on the gate electrode 212 and gate line. The insulating interlayer 230 may be formed in a single-layered structure of the inorganic insulating material such as silicon oxide (SiOx) or silicon nitride (SiNx), or a multi-layered structure of the above silicon oxide (SiOx), silicon nitride (SiNx) and their alloys, but not limited to these materials.

The source electrode 213, the drain electrode 214, and the data line may be provided on the insulating interlayer 230. Each of the source electrode 213 and the drain electrode 214 may be connected with the active layer 211 via a contact hole penetrating through the gate insulating film 220 and the insulating interlayer 230. The source electrode 213, the drain electrode 214, and the data line may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but not limited to these materials.

A protection film 240 for an insulation of the thin film transistor 210 may be provided on the source electrode 213, the drain electrode 214, and the data line. The protection film 240 may be formed in a single-layered structure of the inorganic material such as silicon oxide (SiOx) or silicon nitride (SiNx), or a multi-layered structure of the above silicon oxide (SiOx) and silicon nitride (SiNx), but not limited to these structures.

A planarization film 250 may be provided on the protection film 240 so as to planarize a step difference area caused by the thin film transistor 210. The planarization film 250 may be formed of an organic material, for example, acryl resin, epoxy resin, phenolic resin, polyamide resin, polyimide resin, and etc., but not limited to these materials.

The organic light emitting device 260 and a bank 270 are provided on the planarization film 250. The organic light emitting device 260 may include the first electrode 261, the organic light emitting layer 262, and the second electrode 263. The first electrode 261 may serve as an anode electrode, and the second electrode 263 may serve as a cathode electrode.

The first electrode 261 may be provided on the planarization film 250. The first electrode 261 may be connected with the drain electrode 214 (or source electrode 213) of the thin film transistor 210 via a contact hole penetrating through the planarization film 250. The first electrode 261 may be formed of a metal material with high reflectance, and more particularly, a deposition structure of aluminum and titanium (Ti/Al/Ti), a deposition structure of aluminum and Indium Tin Oxide (ITO/AL/ITO), an APC alloy, and a deposition structure of APC alloy and Indium Tin Oxide (ITO/APC/ITO), but not limited to any of them. Herein, the APC alloy is an alloy of argentums (Ag), palladium (Pd), and copper (Cu), for example.

The bank 270 is provided to cover the edge of the first electrode 261 on the planarization film 250, to thereby divide the subpixels (SP1, SP2, SP3, SP4). That is, the bank 270 functions as a pixel defining film so as to define the subpixels (SP1, SP2, SP3, SP4).

Each of the subpixels (SP1, SP2, SP3, SP4) indicates a light-emission area, wherein the first electrode corresponding to the anode electrode, the organic light emitting layer, and the second electrode corresponding to the cathode electrode are sequentially deposited in each subpixel, and hole and electron are respectively supplied from the first electrode and the second electrode, and are then combined with each other in the organic light emitting layer so as to emit light. In this case, the area for the bank 270 does not emit light, whereby the area for the bank 270 may be defined as a non-emission area.

The bank 270 may be formed of an organic material, for example, acryl resin, epoxy resin, phenolic resin, polyamide resin, polyimide resin, and etc., but not limited to these materials.

The organic light emitting layer 262 is provided on the first electrode 261 and the bank 270. The organic light emitting layer 262 is a common layer provided on the subpixels (SP1, SP2, SP3, SP4, e.g., for colors red, green, blue and white, respectively) in common. The organic light emitting layer may be a white light emitting layer for emitting white light. In this case, the organic light emitting layer 262 may be deposited by the use of open mask with an opening in an entire display area.

If the organic light emitting layer 262 is formed of the common layer for emitting white light, the organic light emitting layer 262 may have a tandem structure of 2 stacks or more than 2 stacks. Each stack may include a hole transporting layer, at least one light emitting layer, and an electron transporting layer.

Between each of the stacks, there may be a charge generation layer. The charge generation layer may include an n-type charge generation layer positioned adjacent to the lower stack, and a p-type charge generation layer provided on the n-type charge generation layer and positioned adjacent to the upper stack. The n-type charge generation layer injects the electron into the lower stack, and the p-type charge generation layer injects the hole into the upper stack. The n-type charge generation layer may be formed of an organic layer doped with alkali metal such as lithium (Li), natrium (Na), kalium (K) or cesium (Cs), or alkali earth metal such as magnesium (Mg), strontium (Sr), barium (Ba) or radium (Ra), but not limited to any of them. The P-type charge generation layer may be formed of an organic layer obtained by doping an organic host material having a hole transporting capacity with dopant.

In FIG. 5, the organic light emitting layer 262 is the common layer provided on the subpixels (SP1, SP2, SP3, SP4) in common, and the organic light emitting layer 262 is the white light emitting layer, but not limited to this type. That is, the organic light emitting layer 262 may be provided for every subpixel (SP1, SP2, SP3, SP4) separately. In this case, the first subpixel (SP1) includes a first emitting layer for emitting light with a first color, the second subpixel (SP2) includes a second emitting layer for emitting light with a second color, the third subpixel (SP3) includes a third emitting layer for emitting light with a third color, and the fourth subpixel (SP4) includes a fourth emitting layer for emitting light with a fourth color. For example, the first emitting layer may be a red light emitting layer, the second emitting layer may be a green light emitting layer, the third emitting layer may be a blue light emitting layer, and the fourth emitting layer may be a white light emitting layer. In this case, the first to fourth emitting layers may be deposited by the use of fine metal mask (FMM).

The second electrode 263 is provided on the organic light emitting layer 262. The second electrode 263 is a common layer provided on the subpixels (SP1, SP2, SP3, SP4) in common. The second electrode 263 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag), but not limited to any of them. If the second electrode 263 is formed of the semi-transmissive conductive material, it is possible to realize high emission efficiency by a micro-cavity effect. A capping layer may be provided on the second electrode 263.

An encapsulation film 280 is provided on the second electrode 263. The encapsulation film 280 may prevent a permeation of oxygen or moisture into the organic light emitting layer 262 and the second electrode 263. The encapsulation film 280 may include at least one inorganic film. Also, the encapsulation film 280 may further include at least one inorganic film to prevent particles from getting into the organic light emitting layer 262 and the second electrode 263 via the inorganic film. For example, the encapsulation film 280 may include a first inorganic film 281, an organic film 282, and a second inorganic film 283, as shown in FIG. 4A.

The first inorganic film 281 is disposed on the second electrode 263. The first inorganic film 281 is provided to cover the second electrode 263.

The organic film 282 is disposed on the first inorganic film 281. The organic film 282 may have a sufficient thickness to prevent the particles from getting into the organic light emitting layer 262 and the second electrode 263 via the first inorganic film 281.

The second inorganic film 283 is disposed on the organic film 282. The second inorganic film 283 is provided to cover the organic film 282.

Each of the first and second inorganic films 281 and 283 may be formed of silicon nitride, aluminum nitride, zirconium nitride, titanium nitride, hafnium nitride, tantalum nitride, silicon oxide, aluminum oxide, or titanium oxide.

Then, first to third color filters 291, 292, and 293 and a low refractive index layer 294 may be disposed on the encapsulation film 280.

The first color filter 291 is disposed in the first subpixel (SP1), the second color filter 292 is disposed in the second subpixel (SP2), and the third color filter 293 is disposed in the third subpixel (SP3). For example, the first color filter 291 may be a red color filter, the second color filter 292 may be a green color filter, and the third color filter 293 may be a blue color filter.

If the first to third color filters 291, 292, and 293 are directly formed on the encapsulation film 280, there is no need for an alignment process when the first substrate 111 and the second substrate 112 are bonded to each other. Furthermore, there is no need for an additional bonding layer so that it is possible to reduce a thickness of a display panel. Also, if the first to third color filters 291, 292, and 293 are directly formed on the encapsulation film 280, it is possible to reduce a distance between the organic light emitting layer 262 and each of the first to third color filters 291, 292, and 293, and furthermore, it is possible to minimize a color mixing without using a black matrix. That is, it is possible to omit the black matrix.

The low refractive index layer 294 may be disposed in the fourth subpixel (SP4). The low refractive index layer 294 may be formed of a material whose refractive index is relatively lower than that of each of the first to third color filters 291, 292, and 293. Generally, a refractive index of each of the first to third color filters is 1.5× or more than 1.5×. Thus, the low refractive index layer 294 may be formed of siloxane whose refractive index is between 1.3× and 1.5×, acryl whose refractive index is between 1.4× and 1.5×, epoxy whose refractive index is 1.4, or fluoride whose refractive index is 1.3×. The lower refractive index layer 294 may be formed of siloxane, acryl, epoxy, or fluoride including hollow particles by a hollow injection. The low refractive index layer 294 may also be air whose refractive index is 1.0. Other low refractive index materials are also possible for layer 294 and are included in the disclosure.

The refractive index of the low refractive index layer 294 is relatively lower than the refractive index of each of the first to third color filters 291, 292, and 293. Thus, if light (L1) emitted from the organic light emitting layer 262 of the pixel adjacent to the fourth subpixel (SP4) is incident at an angle (θ1) above a first threshold angle, as shown in FIG. 5, the light (L1) may be totally reflected on the boundaries between the color filter and the low refractive index layer 294 due to a refractive index difference between the color filter and the low refractive index layer 294. Accordingly, the light (L1) emitted from the organic light emitting layer 262 of the pixel adjacent to the fourth subpixel (SP4) advances toward a front surface of the display panel 110 so that it is possible to prevent a loss of the light emitted from the organic light emitting layer 262 of the pixel adjacent to the fourth subpixel (SP4).

Also, even though light (L2) emitted from the organic light emitting layer 262 of the pixel adjacent to the fourth subpixel (SP4) is incident at an angle (θ2) below the first threshold angle, the light (L2) may be refracted in a direction of the front surface of the display panel 110, as shown in FIG. 5, due to the refractive index difference between the color filter(s) 291, 292, 293 and the low refractive index layer 294, so that it is possible to prevent a loss of the light emitted from the organic light emitting layer 262 of the pixel adjacent to the fourth subpixel (SP4).

Also, if light (L3) emitted from the organic light emitting layer 262 of the fourth subpixel (SP4) advances from the low refractive index layer 294 toward the color filter of the pixel adjacent to the fourth subpixel (SP4), it is possible to prevent a color mixing of the light. However, if the light (L3) emitted from the organic light emitting layer 262 of the fourth subpixel (SP4) advances from the low refractive index layer 294 toward the color filter of the pixel adjacent to the fourth subpixel (SP4), the light (L3) may be refracted to a lateral surface direction of the display panel 110 due to the refractive index difference between the color filter and the low refractive index layer 294 so that it is possible to prevent a color mixing by the light (L3) emitted from the organic light emitting layer 262 of the fourth subpixel (SP4). In this case, it is possible to omit the black matrix.

Meanwhile, with reference also to FIG. 3, the width (W4) of the fourth subpixel (SP4) in the first direction (X-axis direction) may be smaller than the width (W1) of the first subpixel (SP1) in the first direction (X-axis direction), the width (W2) of the second subpixel (SP2) in the first direction (X-axis direction), and the width (W3) of the third subpixel (SP3) in the first direction (X-axis direction). Also, the first color filter 291 is disposed in the first subpixel (SP1), the second color filter 292 is disposed in the second subpixel (SP2), the third color filter 293 is disposed in the third subpixel (SP3), and the low refractive index layer 294 is disposed in the fourth subpixel (SP4). Accordingly, a width of the low refractive index layer 294 may be smaller than the width (W1) of the first subpixel (SP1), the width (W2) of the second subpixel (SP2), and the width (W3) of the third subpixel (SP3), as shown in FIG. 4A.

The second substrate 112 is provided on the first to third color filters 291, 292, and 293 and the low refractive index layer 294. The second substrate 112 may be a plastic film, a glass substrate, or an encapsulation film (or protection film).

As described above, the fourth subpixel (SP4) for each of the pixels (P) is disposed between each of the first, second and third subpixels (SP1, SP2, SP3). As a result, it is possible to emit the white light by the use of fourth subpixel (SP4) disposed between each of the first, second and third sub pixels (SP1, SP2, SP3), to thereby maximize the luminance improvement by the white pixel.

Also, the low refractive index layer 294 is disposed in the fourth subpixel (SP4). As a result, the light (L2) emitted from the organic light emitting layer 262 of the pixel adjacent to the fourth subpixel (SP4) is totally reflected or refracted by the refractive index difference between the color filter and the low refractive index layer 294, whereby the light (L2) advances in the front surface direction of the display panel 110. Accordingly, it is possible to prevent a loss of the light emitted from the organic light emitting layer 262 of the pixel adjacent to the fourth subpixel (SP4).

Furthermore, the light (L3) emitted from the organic light emitting layer 262 of the fourth subpixel (SP4) is refracted to the lateral surface direction of the display panel 110 by the refractive index difference between the color filter and the low refractive index layer 294 so that it is possible to prevent a color mixing by the light (L3) emitted from the organic light emitting layer 262 of the fourth subpixel (SP4).

Figure 4B:
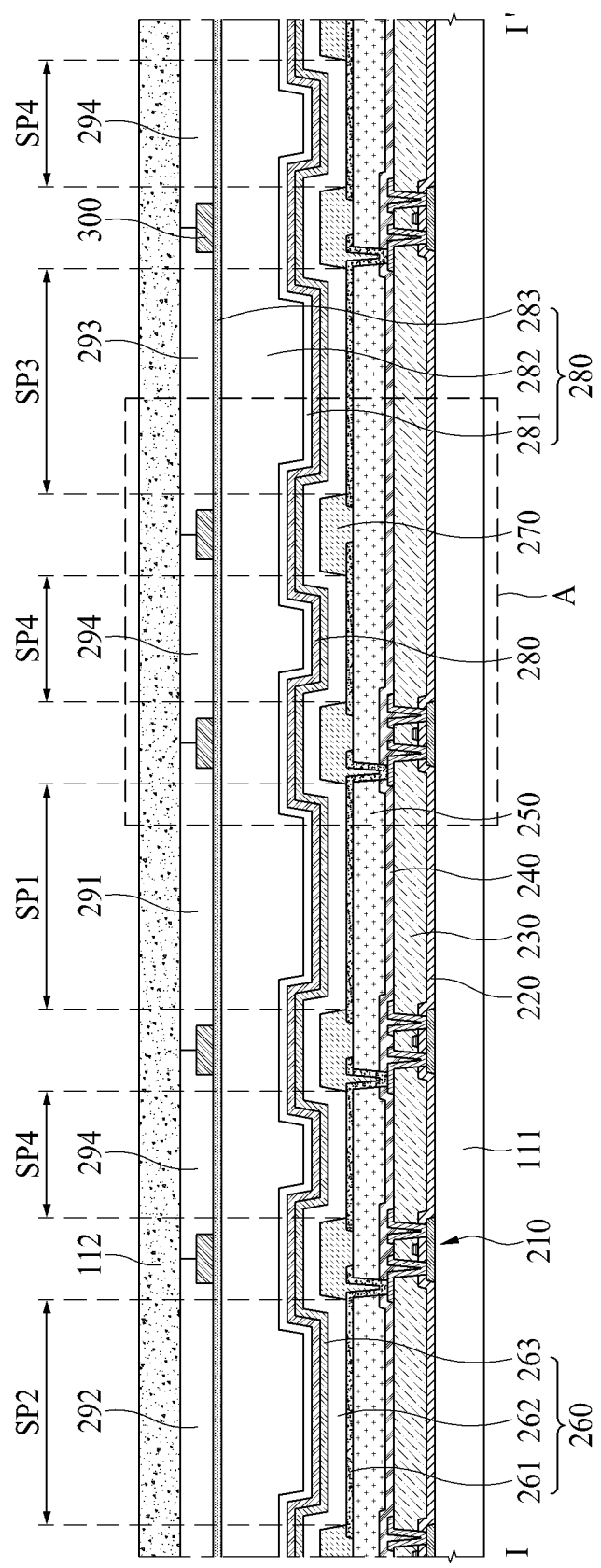
FIG. 4B is another example cross sectional view along I-I' of FIG. 3

FIG. 4B shows another example of a cross sectional view along I-I' of FIG. 3.

Referring to FIG. 4B, at least one black matrix layer 300 is disposed between each adjacent two of the first, second and the third color filters 291, 292, and 293 and the low refractive index layer 294. Because the low refractive index layer 294 is disposed between each adjacent two of the color filters 291, 292 and 293, at least one black matrix layer 300 is in turn disposed between the each adjacent two of the color filters 291, 292 and 293. The black matrix layer 300 may further prevent a coloring mixing by the light (L3) emitted from the organic light emitting layer 262 of the fourth subpixel (SP4).

It should be appreciated that although FIG. 4B shows, as an illustrative example, that black matrix layer 300 and low refractive index layer 294 are used together, this example is not limiting. It is possible that the black matrix layer 300 is used without low refractive layer 294 to prevent a coloring mixing by the light (L3) emitted from the organic light emitting layer 262 of the fourth subpixel (SP4), which is also included in the disclosure.

Figure 6:
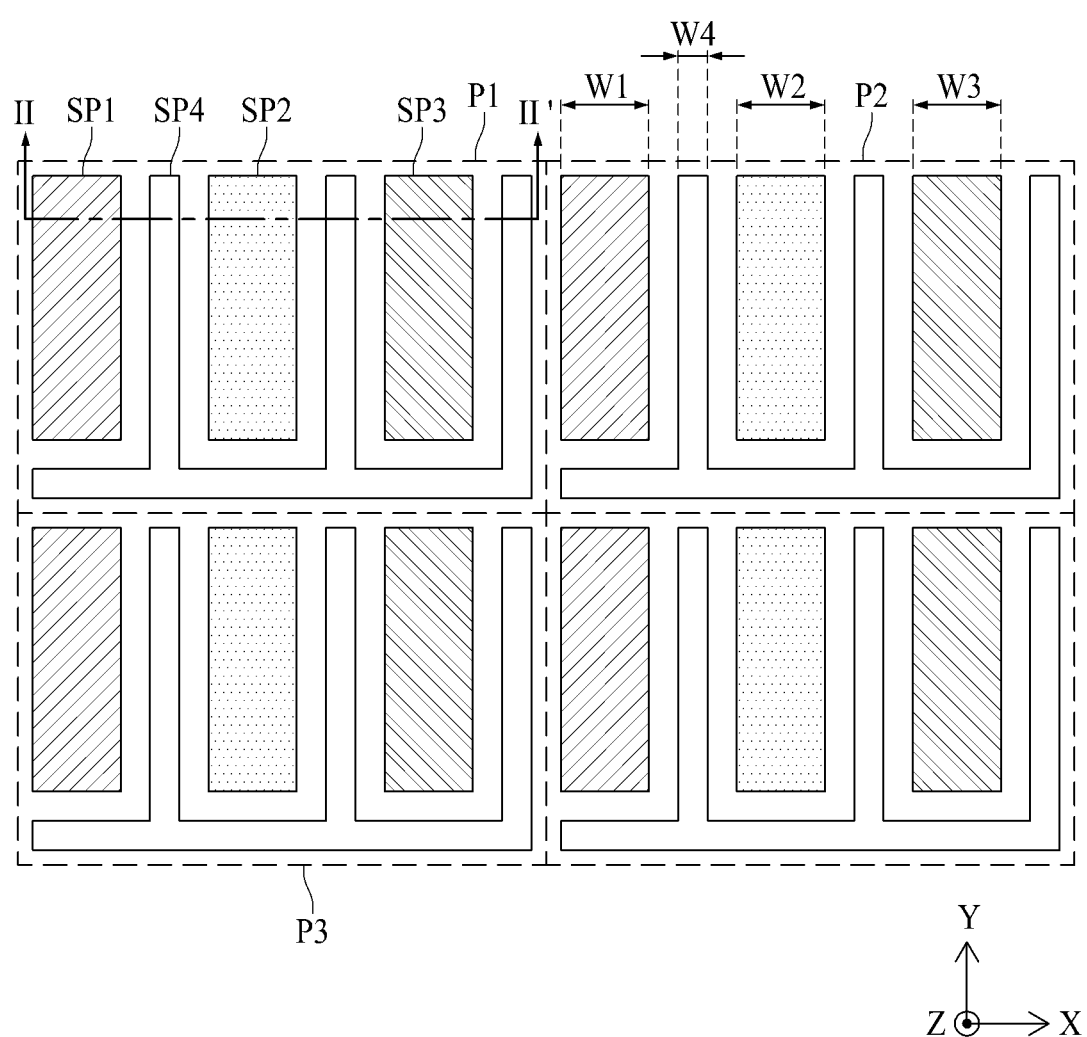
FIG. 6 is a plane view illustrating another example of pixels in a display area.

FIG. 6 is a plane view illustrating another example of the pixels in the display area.

In FIG. 6, the pixels which neighbor each other in the first direction (X-axis direction) are referred to as the first and second pixels (P1, P2), and the pixels which neighbor each other in the second direction (Y-axis direction) are referred to as the first and third pixels (P1, P3).

Referring to FIG. 6, each of the pixels (P1, P2, P3) may include a first, a second, a third and a fourth subpixel (SP1, SP2, SP3, SP4). The first subpixel (SP1) emits first-color light, the second sub pixel (SP2) emits second-color light, the third sub pixel (SP3) emits third-color light, and the fourth subpixel (SP4) emits fourth-color light. For example, the first subpixel (SP1) may be a red subpixel for emitting red light, the second subpixel (SP2) may be a green subpixel for emitting green light, the third subpixel (SP3) may be a blue subpixel for emitting blue light, and the fourth subpixel (SP4) may be a white sub pixel for emitting white light, but not limited to this structure configuration.

The first, second and third subpixels (SP1, SP2, SP3) of the first pixel (P1) may be arranged in series in the first direction (X-axis direction), as shown in FIG. 6. The fourth subpixel (SP4) of the first pixel (P1) may be disposed between adjacent first, second and third subpixels (SP1, SP2, SP3). For example, as shown in FIG. 6, the fourth subpixel (SP4) of the first pixel (P1) is disposed between the first and second sub pixels (SP1, SP2) and between the second and third subpixels (SP2, SP3). Also, the fourth subpixel (SP4) of the first pixel (P1) may be disposed between adjacent first, second and third subpixels (SP1, SP2, SP3) of two neighboring pixels. For example, as shown in FIG. 6, the fourth subpixel (SP4) of the first pixel (P1) is disposed between the third subpixel (SP3) of the first pixel (P1) and the first subpixel (SP1) of the neighboring second pixel (P2). Also, the fourth subpixel (SP4) of the first pixel (P1) may be disposed between the first subpixel (SP1) of the first pixel (P1) and the first subpixel (SP1) of the neighboring third pixel (P3), between the second subpixel (SP2) of the first pixel (P1) and the second subpixel (SP2) of the neighboring third pixel (P3), and between the third subpixel (SP3) of the first pixel (P1) and the third subpixel (SP3) of the neighboring third pixel (P3).

FIG. 6 shows as an illustrative example that the first subpixel, second subpixel, and third subpixel (SP1, SP2, SP3) in neighboring pixels P1, P2 and P3 are of the same sequence, e.g., SP1, SP2, SP3, in the first direction (X-axis direction). The disclosure is not limited by this example configuration and one or both of the neighboring pixels P2 and P3 may include different sequence configuration(s) of the first subpixel, second subpixel and the third subpixel (SP1, SP2, SP3) therein than that of the first pixel P1, which are all included in the disclosure. For example, the neighboring third pixel P3 may include a sequence of subpixels SP2, SP3 and SP1 in the first direction (X-axis direction) such that the adjacent pixels to the first subpixel (SP1), second subpixel (SP2) and third subpixel (SP3) between neighboring first pixel (P1) and third pixel (P3) are of different colors.

Further, in FIG. 6, the first, second and third subpixels of a pixel are illustrated as arranged in series in the first direction (X-axis direction), which is not limiting. The first, second and third subpixels of a pixel may also be arranged in series in the second direction (Y-axis direction), which is also included in the disclosure.

A width (W4) of the fourth subpixel (SP4) in the first direction (X-axis direction), for example (similar description also apply to width in the second direction/Y-axis direction), for each of the pixels (P1, P2, P3) may be smaller than a width (W1) of the first subpixel (SP1) in the first direction (X-axis direction), a width (W2) of the second subpixel (SP2) in the first direction (X-axis direction), and a width (W3) of the third subpixel (SP3) in the first direction (X-axis direction). Even though the width (W4) of the fourth subpixel (SP4) in the first direction (X-axis direction) is smaller than the width of each of the first to third subpixels (SP1, SP2, SP3) in the first direction (X-axis direction), the fourth subpixel (SP4) is disposed between each of the first to third subpixels (SP1~SP3), whereby an area of the fourth subpixel (SP4) in each pixel (P1, P2, P3) is similar to an area for each of the first to third subpixels (SP1~SP3). That is, the fourth subpixel (SP4) is appropriately disposed in each pixel (P1, P2, P3) so that it is possible to maximize a luminance improvement by the fourth subpixel (SP4).

Meanwhile, except for the position of the first subpixel (SP1), the second subpixel (SP2), and the third subpixel (SP3), the cross section along II-II' of FIG. 6 may be identical or similar to the cross section of FIG. 4A, whereby a detailed description for the cross section of FIG. 6 will be omitted.

As described above, the fourth subpixel (SP4) for each of the pixels (P1, P2, P3) is disposed between each adjacent subpixel of the first, second and third subpixels (SP1, SP2, SP3). Accordingly, it is possible to emit white light by the use of the fourth subpixel (SP4) disposed between each of the first to third subpixels (SP1~SP3), to thereby maximize a luminance improvement by the white pixel.

Figure 7:
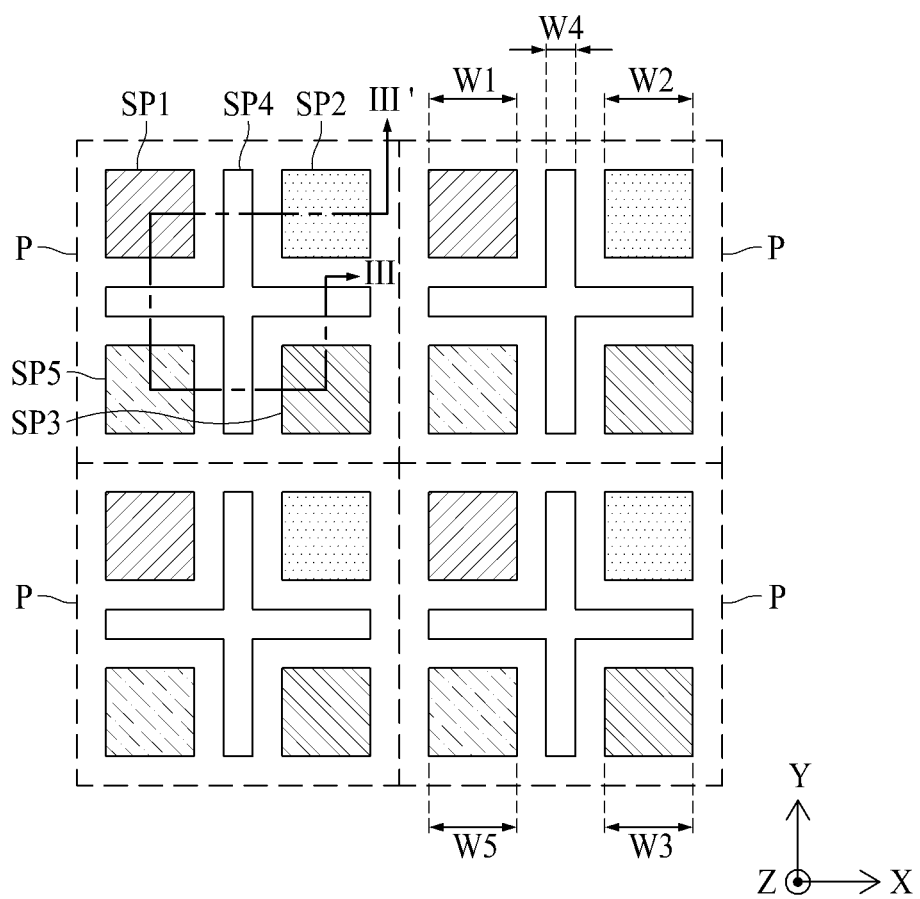
FIG. 7 is a plane view illustrating another example of pixels in a display area.

FIG. 7 is a plane view illustrating another example of the pixels in the display area.

Referring to FIG. 7, each of the pixels (P) may include five subpixels, first, second, third, fourth and fifth subpixels (SP1, SP2, SP3, SP4, SP5). The first subpixel (SP1) emits first-color light, the second subpixel (SP2) emits second-color light, the third subpixel (SP3) emits third-color light, the fourth subpixel (SP4) emits fourth-color light, and the fifth subpixel (SP5) emits one of the first-color light, the second-color light, and the third-color light. For example, the first subpixel (SP1) may be a red subpixel for emitting red light, the second subpixel (SP2) may be a green subpixel for emitting green light, the third subpixel (SP3) may be a blue subpixel for emitting blue light, the fourth subpixel (SP4) may be a white sub pixel for emitting white light, and the fifth subpixel (SP5) may be a green subpixel for emitting green light, but not limited to this structure.

The first and second subpixels (SP1, SP2) for each pixel (P) may be arranged in the first direction (X-axis direction), and the first and fifth subpixels (SP1, SP5) may be arranged in the second direction (Y-axis direction) crossing over the first direction (X-axis direction). Also, the second and third subpixels (SP2, SP3) may be arranged in the second direction (Y-axis direction), and the third and fifth subpixels (SP3, SP5) may be arranged in the first direction (X-axis direction).

The fourth subpixel (SP4) of each pixel (P) may be disposed between each two adjacent subpixels of the first, second third and fifth subpixels (SP1, SP2, SP3, SP5) in the first direction or the second direction. For example, as shown in FIG. 7, the fourth subpixel (SP4) of each pixel (P) is disposed between the adjacent first and second subpixels (SP1, SP2) in the first direction, and between the adjacent second and third subpixels (SP2, SP3) in the second direction. Also, the fourth subpixel (SP4) of each pixel (P) may be disposed between the adjacent first and fifth subpixels (SP1, SP5) in the second direction and between the adjacent third and fifth subpixels (SP3, SP5) in the first direction. In this case, a shape of the fourth subpixel (SP4) on the plane may be a cross shape.

A width (W4) of the fourth subpixel (SP4) in the first direction (X-axis direction) for each pixel (P) may be smaller than a width (W1) of the first subpixel (SP1) in the first direction (X-axis direction), a width (W2) of the second subpixel (SP2) in the first direction (X-axis direction), a width (W3) of the third subpixel (SP3) in the first direction (X-axis direction), and a width (W5) of the fifth subpixel (SP5) in the first direction (X-axis direction). Even though the width (W4) of the fourth subpixel (SP4) in the first direction (X-axis direction) is smaller than the width of each of the first to third subpixels (SP1, SP2, SP3) and the fifth subpixel (SP5) in the first direction (X-axis direction), the fourth subpixel (SP4) is disposed between each of the first to third subpixels (SP1~SP3) and the fifth subpixel (SP5), whereby an area of the fourth subpixel (SP4) in each pixel (P1, P2, P3) is similar to an area for each of the first to third subpixels (SP1~SP3) and the fifth subpixel (SP5). That is, the fourth subpixel (SP4) is appropriately disposed in each pixel (P) so that it is possible to maximize a luminance improvement by the fourth subpixel (SP4).

The above description about widths in the first direction (X-axis direction) may also apply to the widths in the second direction (Y-axis direction), which is also included in the disclosure.

Meanwhile, except for the relative position of the first, second, third and fourth subpixels (SP1, SP2, SP3, SP4), and the additionally provided fifth subpixel (SP5), the cross section along line III-III' of FIG. 7 may be very similar or identical to the cross section of FIG. 4A, whereby a detailed description for the cross section along line III-III' of FIG. 7 will be omitted.

As described above, the fourth subpixel (SP4) for each pixel (P) is disposed between each two adjacent ones of the first, second, and third subpixels (SP1, SP2, SP3) and the fifth subpixel (SP5) in either the first direction or the second direction. Accordingly, it is possible to emit white light by the use of the fourth subpixel (SP4) disposed between each adjacent two of the first, second, and third subpixels (SP1, SP2, SP3) and the fifth subpixel (SP5), to thereby maximize a luminance improvement by the white pixel.

Figure 8:
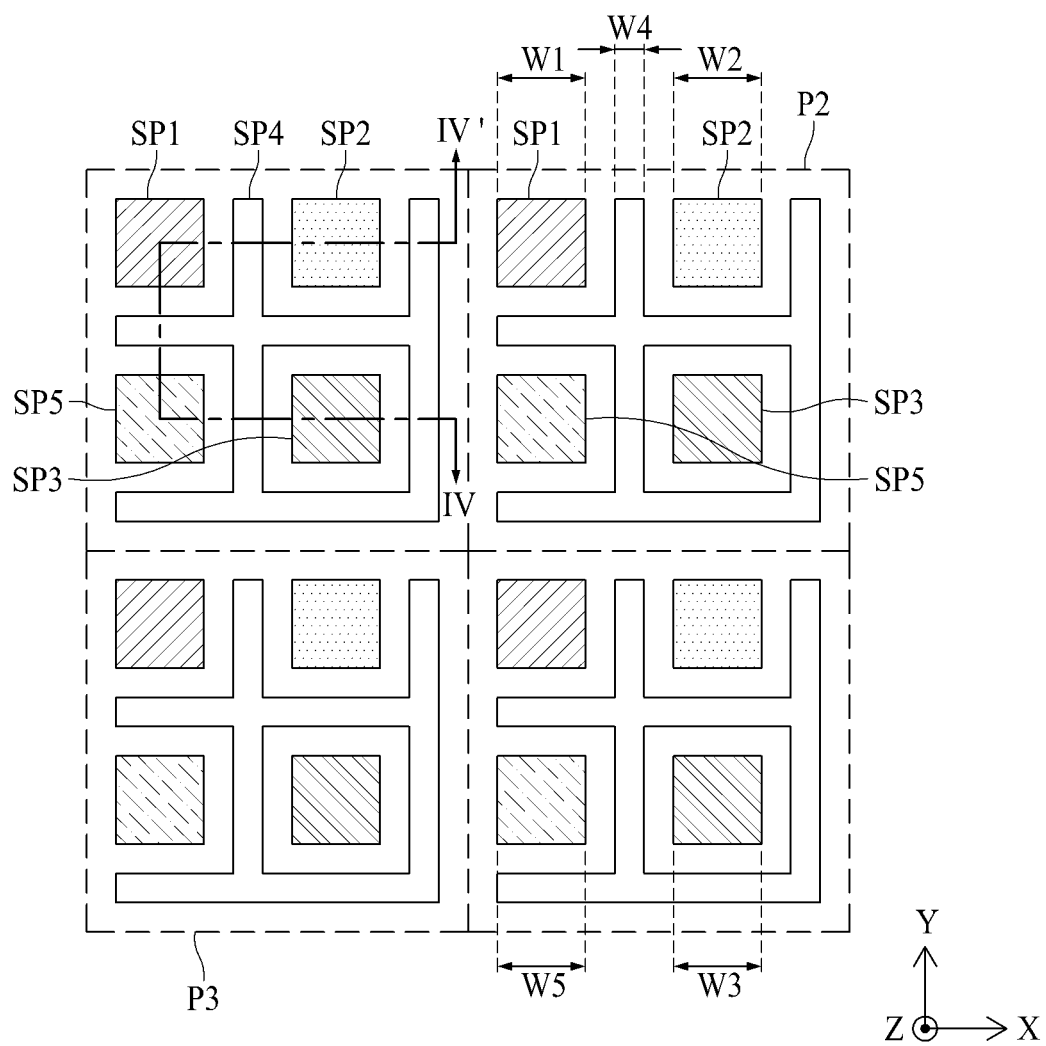
FIG. 8 is a plane view illustrating another example of pixels in a display area.

FIG. 8 is a plane view illustrating another example of the pixels in the display area.

In FIG. 8, the pixels which neighbor one another in the first direction (X-axis direction) are referred to as the first and second pixels (P1, P2), and the pixels which neighbor each other in the second direction (Y-axis direction) are referred to as the first and third pixels (P1, P3).

Except for the fourth subpixel (SP4) for each pixel (P1, P2, P3), the plane view of FIG. 8 is identical to the aforementioned description of FIG. 7, whereby a detailed description for each of the first, second and third subpixels (SP1, SP2, SP3) and the fifth subpixel (SP5) will be omitted.

Referring to FIG. 8, the fourth subpixel (SP4) of the a pixel, e.g., the first pixel (P1), may be disposed between each two adjacent ones of the first subpixel, second subpixel, third subpixel and fifth subpixel (SP1, SP2, SP3, SP5) in either the first direction (X-axis direction) or the second direction (Y-axis direction). For example, as shown in FIG. 8, the fourth subpixel (SP4) of the first pixel (P1) is disposed between the adjacent first and second subpixels (SP1, SP2) in the first direction and between the adjacent second and third subpixels (SP2, SP3) in the second direction. Also, the fourth subpixel (SP4) of the first pixel (P1) may be disposed between the adjacent first and fifth subpixels (SP1, SP5) in the second direction, and between the adjacent third and fifth subpixels (SP3, SP5) in the first direction.

Also, the fourth subpixel (SP4) of a pixel, e.g., the first pixel (P1), may be disposed between each two adjacent ones of the first subpixel, second subpixel, third subpixel and fifth subpixel (SP1, SP2, SP3, SP5) of the pixel and of a neighboring pixel. For example, as shown in FIG. 8, the fourth subpixel (SP4) of the first pixel (P1), may be disposed between the second subpixel (SP2) of the first pixel (P1) and the adjacent first subpixel (SP1) of the neighboring second pixel (P2), and between the third subpixel (SP3) of the first pixel (P1) and the adjacent fifth subpixel (SP5) of the neighboring second pixel (P2). Also, the fourth subpixel (SP4) of the first pixel (P1) may be disposed between the fifth subpixel (SP5) of the first pixel (P1) and the adjacent first subpixel (SP1) of the neighboring third pixel (P3), and between the third subpixel (SP3) of the first pixel (P1) and the adjacent second subpixel (SP2) of the neighboring third pixel (P3).

A width (W4) of the fourth subpixel (SP4) in the first direction (X-axis direction) for each pixel (P1, P2, P3) may be smaller than a width (W1) of the first subpixel (SP1) in the first direction (X-axis direction), a width (W2) of the second subpixel (SP2) in the first direction (X-axis direction), a width (W3) of the third subpixel (SP3) in the first direction (X-axis direction), and a width (W5) of the fifth subpixel (SP5) in the first direction (X-axis direction). Even though the width (W4) of the fourth subpixel (SP4) in the first direction (X-axis direction) is smaller than the width of each of the first to third subpixels (SP1, SP2, SP3) and the fifth subpixel (SP5) in the first direction (X-axis direction), the fourth subpixel (SP4) is disposed between each of the first to third subpixels (SP1~SP3) and the fifth subpixel (SP5), whereby an area of the fourth subpixel (SP4) in each pixel (P1, P2, P3) is similar to an area for each of the first to third subpixels (SP1~SP3) and the fifth subpixel (SP5). That is, the fourth subpixel (SP4) is appropriately disposed in each pixel (P) so that it is possible to maximize a luminance improvement by the fourth subpixel (SP4).

The above description about widths in the first direction (X-axis direction) may also apply to the widths in the second direction (Y-axis direction), which is also included in the disclosure.

Meanwhile, except for the relative position of the first, second and third subpixels (SP1, SP2, SP3), the additionally provided fifth subpixel (SP5), and possible the fourth color filter disposed in the fifth subpixel (SP5), the cross section along IV-IV' of FIG. 8 may be identical or very similar to the aforementioned description of FIG. 4A, whereby a detailed description for the cross section of FIG. 8 will be omitted.

As described above, the fourth subpixel (SP4) for each pixel (P1, P2, P3) is disposed between each of the first to third subpixels (SP1~SP3) and the fifth subpixel (SP5). Accordingly, it is possible to emit white light by the use of the fourth subpixel (SP4) disposed between each of the first to third subpixels (SP1~SP3) and the fifth subpixel (SP5), to thereby maximize a luminance improvement by the white pixel.

According to the present disclosure, the fourth subpixel (SP4) for each of the pixels (P1, P2, P3) is disposed between each of the first to third subpixels (SP1~SP3). Accordingly, it is possible to emit white light by the use of the fourth subpixel (SP4) disposed between each of the first to third subpixels (SP1~SP3), to thereby maximize the luminance improvement by the white pixel.

Also, with reference also to FIG. 4A, the low refractive index layer 294 is disposed in the fourth subpixel (SP4). As a result, the light emitted from the organic light emitting layer 262 of the pixel adjacent to the fourth subpixel (SP4) is totally reflected or refracted by the refractive index difference between the color filter and the low refractive index layer 294, whereby the light advances in the front surface direction of the display panel 110. Accordingly, it is possible to prevent a loss of the light emitted from the organic light emitting layer 262 of the pixel adjacent to the fourth subpixel (SP4).

Furthermore, the light emitted from the organic light emitting layer 262 of the fourth subpixel (SP4) may be refracted to the lateral surface direction of the display panel 110 due to the refractive index difference between the color filter and the low refractive index layer 294 so that it is possible to prevent a color mixing by the light emitted from the organic light emitting layer 262 of the fourth subpixel (SP4).

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

Figure 9A:
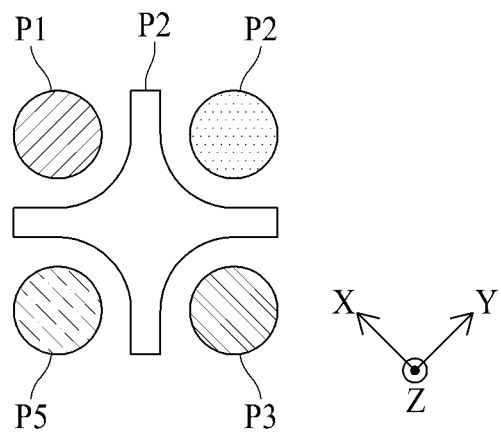
FIG. 9A is a plane view illustrating another example of pixels in a display area.
Figure 9B:
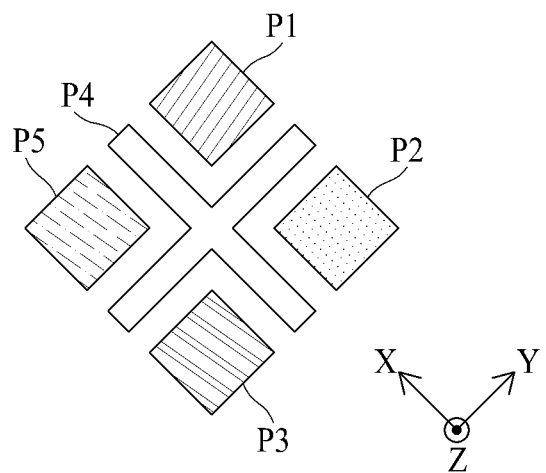
FIG. 9B is a plane view illustrating another example of pixels in a display area.

In this disclosure, the shapes of the first, second, third and/or fifth subpixels (SP1, SP2, SP3, SP5) are, as an example, illustrated as square/rectangular, and the shape of the fourth subpixel (SP4) is illustrated as including bend regions, e.g., multiple L shaped bend regions or cross-shaped bend regions. These examples are for illustrative purposes only and none limits the scope of the disclosure. The first, second, third and/or fifth subpixels (SP1, SP2, SP3, SP5) and/or the fourth subpixel (SP4) may include other shapes and all are included in the disclosure. For example FIGS. 9A and 9B illustrates two other examples of the shapes of the first, second, third and/or fifth subpixels (SP1, SP2, SP3, SP5) and the shape of the fourth subpixel (SP4).

Further, in the disclosure, the fourth subpixel (SP4) is illustrated and described as a single integrated subpixel structure, as an example, which does not limit the disclosure. The fourth subpixel may include multiple separate regions, e.g., multiple separate L shaped regions which are either electrically connected together, e.g., in another layer, or may be electrically separate. That is, there may be multiple fourth subpixels of white light disposed among the color pixels SP1, SP2, SP3 and/or SP5. All these variants are included in the disclosure.

Further, the term "subpixel" is used in the disclosure only relative to a "pixel". The subpixels, SP1, SP2, SP3, SP4, SP5 each may be essentially in structure and/or in function a pixel from another perspective, which are all included in the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display (OLED) device comprising a plurality of pixels, each pixel including a first subpixel for emitting first-color light, a second subpixel for emitting second-color light, a third subpixel for emitting third-color light, and a fourth subpixel for emitting fourth-color light, the fourth subpixel positioned between pairs of adjacent ones of the first subpixel, the second subpixel and the third subpixel, and wherein at least one of the first subpixel, the second subpixel or the third subpixel is adjacent to the fourth subpixel by at least two sides thereof.

2. The OLED device according to claim 1, wherein a width of the fourth subpixel in a first direction is smaller than each one of a width of the first subpixel in the first direction, a width of the second subpixel in the first direction, and a width of the third subpixel in the first direction.

3. The OLED device according to claim 1, wherein,
the first subpixel includes a first color filter,
the second subpixel includes a second color filter,
the third subpixel includes a third color filter, and
the fourth subpixel includes a low refractive index layer whose refractive index is lower than that of each of the first color filter, the second color filter and the third color filter.

4. The OLED device according to claim 1, wherein a shape of the fourth subpixel in a first pixel of the plurality of pixels is different from a shape of the fourth subpixel in a second pixel of the plurality of pixels, the first pixel and the second pixel neighboring with one another.

5. The OLED device according to claim 1, wherein the plurality of pixels include a first pixel and a second pixel which neighbor with one another in a first direction,
wherein the first and second subpixels of the first pixel are arranged in a second direction which crosses over the first direction, and the first and third subpixels of the first pixel are arranged in the first direction, and
wherein the first and third subpixels of the second pixel and the second subpixel of the first pixel are parallel in the first direction, and the second subpixel of the second pixel, and the first and third subpixels of the first pixel are parallel in the first direction.

6. The OLED device according to claim 5, wherein the fourth subpixel of the first pixel is disposed between the second subpixel of the first pixel and the first subpixel of the second pixel, and between the third subpixel of the first pixel and the second subpixel of the second pixel.

7. The OLED device according to claim 1, wherein the plurality of pixels include a first pixel and a second pixel which neighbor one another in a first direction,
wherein the first, second and the third subpixels of each of the first and second pixels are parallel in the first direction, and
the fourth subpixel of the first pixel is disposed between the third subpixel of the first pixel and the first subpixel of the second pixel.

8. The OLED device according to claim 1, wherein the plurality of pixels include a first pixel and a third pixel which neighbor with one another in a second direction, wherein the first, second, and third subpixels of each of the first and third pixels are arranged in a first direction which crosses over the second direction, and the fourth subpixel of the first pixel is disposed between the first subpixel of the first pixel and the first subpixel of the third pixel, between the second subpixel of the first pixel and the second subpixel of the third pixel, and between the third subpixel of the first pixel and the third subpixel of the third pixel.

9. The OLED device according to claim 1, wherein each of the plurality of pixels further includes a fifth subpixel for emitting fifth-color light, and wherein the fourth subpixel of each of the pixels is disposed between each two adjacent ones of the first subpixel, the second subpixel, the third subpixel, and the fifth subpixel of the pixel.

10. The OLED device according to claim 9, wherein a width of the fourth subpixel in a first direction is smaller than each of a width of the first subpixel in the first direction, a width of the second subpixel in the first direction, a width of the third subpixel in the first direction, and a width of the fifth subpixel in the first direction.

11. The OLED device according to claim 1, wherein the first subpixel includes a first color filter,
the second subpixel includes a second color filter,
the third subpixel includes a third color filter, and
at least one black matrix disposed between each adjacent two of the first color filter, the second color filter or the third color filter.

12. The OLED device according to claim 9, wherein the plurality of pixels include a first pixel and a second pixel which neighbor with one another in a first direction, wherein within each of the first and the second pixels, the first and second subpixels are arranged in the first direction, the first and fifth subpixels are arranged in a second direction which crosses over the first direction, and the second and third subpixels are arranged in the second direction, and wherein the fourth subpixel of the first pixel is disposed between the second subpixel of the first pixel and the first subpixel of the second pixel, and between the third subpixel of the first pixel and the fifth subpixel of the second pixel.

13. The OLED device according to claim 9, wherein the plurality of pixels include a first pixel and a third pixel which neighbor with one another in a second direction, wherein within each of the first and the third pixels, the first and second subpixels are arranged in a first direction, the first and the fifth subpixels are arranged in the second direction which crosses over the first direction, and the second and the third subpixels are arranged in the second direction, and wherein the fourth subpixel of the first pixel is disposed between the fifth subpixel of the first pixel and the first subpixel of the third pixel, and between the third subpixel of the first pixel and the second subpixel of the third pixel.

14. The OLED device according to claim 9, wherein the fifth-color light is same as one of the first-color light, the second-color light, the third-color light or the fourth-color light.

15. The OLED device according to claim 1, wherein the fourth color-light is white.

16. The OLED device of claim 1, wherein a size of a surface area of the fourth subpixel substantially equals to or smaller than a size of a surface area of each of the first subpixel, the second subpixel or the third subpixel.

17. The OLED device of claim 1, wherein:

the first subpixel includes a first color filter,
the second subpixel includes a second color filter,
the third subpixel includes a third color filter, and
the fourth subpixel includes a low refractive index layer whose refractive index is lower than that of each of the first color filter, the second color filter and the third color filter, and further comprising at least one black matrix disposed between each adjacent two of the first color filter, the second color filter, the third color filter or the low refractive index layer.

18. An electroluminescent display device, comprising:

a light emitting pixel; and
at least four different color subpixels included in the light emitting pixel,
wherein one of the color subpixels is positioned between at least two different pairs of adjacent other color subpixels within the light emitting pixel.

19. The display device of claim 18, wherein two adjacent color subpixels each belongs to a different one of two neighboring light emitting pixels, and the two adjacent color subpixels emit different color lights.

20. An organic light emitting display (OLED) device, comprising:

a plurality of pixels, each pixel including a first subpixel for emitting first-color light, a second subpixel for emitting second-color light, a third subpixel for emitting third-color light, and a fourth subpixel for emitting fourth-color light,
wherein the fourth subpixel has a first portion that is disposed immediately adjacent a first subpixel and a second subpixel and has a second portion that is disposed immediately adjacent the first subpixel and the third subpixel, and
wherein the first color light, the second color light, the third color light and the fourth color light are different from each other.

21. The OLED device of claim 20, wherein the first portion of the fourth subpixel is also disposed between the first subpixel and the second subpixel.

22. The OLED device of claim 20, wherein the second portion of the fourth subpixel is also disposed between the first subpixel and the third subpixel.

23. The OLED device of claim 20, wherein the fourth subpixel is white.

* * * * *